US011283021B2

(12) United States Patent
Sasaki

(10) Patent No.: US 11,283,021 B2
(45) Date of Patent: Mar. 22, 2022

(54) COMPOUND SEMICONDUCTOR DEVICE INCLUDING MOTT INSULATOR FOR PREVENTING DEVICE DAMAGE DUE TO HIGH-ENERGY PARTICLES

(71) Applicant: Mitsubishi Electric Corporation, Tokyo (JP)

(72) Inventor: Hajime Sasaki, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/305,456

(22) PCT Filed: Dec. 22, 2016

(86) PCT No.: PCT/JP2016/088513
§ 371 (c)(1),
(2) Date: Nov. 29, 2018

(87) PCT Pub. No.: WO2018/078893
PCT Pub. Date: May 3, 2018

(65) Prior Publication Data
US 2020/0220079 A1 Jul. 9, 2020

(30) Foreign Application Priority Data

Oct. 24, 2016 (JP) .............................. JP2016-207962

(51) Int. Cl.
*H01L 49/00* (2006.01)
(52) U.S. Cl.
CPC .................. *H01L 49/003* (2013.01)

(58) Field of Classification Search
CPC . H01L 49/003; H01L 29/2003; H01L 29/402; H01L 29/41758; H01L 29/7786; H01L 45/04; H01L 45/1233; H01L 45/146
See application file for complete search history.

(56) References Cited

U.S. PATENT DOCUMENTS

| 6,121,642 A * | 9/2000 | Newns ................... H01L 49/003 |
| | | 257/192 |
| 8,253,169 B2 * | 8/2012 | Kawasaki ......... H01L 29/66863 |
| | | 257/194 |
| 2006/0175670 A1 | 8/2006 | Tsubaki |
| 2010/0059798 A1 | 3/2010 | Kawasaki |
| 2012/0194276 A1 | 8/2012 | Fisher |

(Continued)

FOREIGN PATENT DOCUMENTS

| CN | 1457220 A | 11/2003 |
| CN | 101681911 A | 3/2010 |

(Continued)

OTHER PUBLICATIONS

International Search Report issued in PCT/JP2016/088513; dated Mar. 7, 2017.

(Continued)

*Primary Examiner* — Syed I Gheyas
(74) *Attorney, Agent, or Firm* — Studebaker & Brackett PC

(57) ABSTRACT

A semiconductor layer (2,3) is provided on a substrate (1). A gate electrode (4), a source electrode (5) and a drain electrode (6) are provided on the semiconductor layer (3). A strongly correlated electron system material (12) is connected between the gate electrode (4) and the source electrode (5).

10 Claims, 3 Drawing Sheets

(56) References Cited

U.S. PATENT DOCUMENTS

2016/0284828 A1  9/2016  Shimizu et al.
2017/0263864 A1* 9/2017  Saito ................. H01L 29/786

FOREIGN PATENT DOCUMENTS

| | | | |
|---|---|---|---|
| CN | 102042959 A | 5/2011 | |
| JP | 2006-253654 A | 9/2006 | |
| JP | 2010-067693 A | 3/2010 | |
| JP | 2010-147349 A | 7/2010 | |
| JP | 2011-192836 A | 9/2011 | |
| JP | 2011-243632 A | 12/2011 | |
| JP | 2011-244459 A | 12/2011 | |
| JP | 2016-181632 A | 10/2016 | |
| WO | 2008/058264 A2 | 5/2008 | |
| WO | WO-2018078893 * | 4/2019 | ........... H01L 21/338 |

OTHER PUBLICATIONS

Written Opinion issued in PCT/JP2016/088513; dated Mar. 7, 2017.
Notification of Transmittal of the International Search Report and the Written Opinion of the International Searching Authority, or the Declaration issued in PCT/JP2016/088513 dated Mar. 7, 2017.
An Office Action; "Notification of Reasons for Refusal," issued by the Japanese Patent Office dated May 16, 2017, which corresponds to Japanese Patent Application No. 2017-518380.
An Office Action; "Notification of Reasons for Refusal," issued by the Japanese Patent Office dated Jul. 4, 2017, which corresponds to Japanese Patent Application No. 2017-518380.
An Office Action mailed by China National Intellectual Property Administration dated Jul. 27, 2021 which corresponds to Chinese Patent Application No. 201680090265.2 and is related to U.S. Appl. No. 16/305,456 with English language translation.

* cited by examiner

COMPOUND SEMICONDUCTOR DEVICE INCLUDING MOTT INSULATOR FOR PREVENTING DEVICE DAMAGE DUE TO HIGH-ENERGY PARTICLES

FIELD

The present invention relates to a compound semiconductor device that is hard to be broken and deteriorated even under a severe environment where the compound semiconductor device is exposed to high energy particles.

BACKGROUND

A compound semiconductor device is used as a field effect transistor such as a MES-FET or a HEMT (for example, see PTL 1 to PTL 3). When high energy particles are incident to such a device, the high energy particles may pass through a passivation film, a source field plate, and an active region of the device and reach a substrate, generating a large number of electron-hole pairs around a trajectory of the high-energy particles. Such electron-hole pairs are diffused or recombined according to the mobility of the material, a recombination speed, and an applied voltage.

CITATION LIST

Patent Literature

[PTL 1] JP 2006-253654 A
[PTL 2] JP 2010-67693 A
[PTL 3] JP 2011-243632 A

SUMMARY

Technical Problem

A high electric field is applied between an end portion on a drain electrode side of a source field plate and an AlGaN channel layer. When a large number of electron-hole pairs are generated in the passivation film, by way of high-energy particles being incident upon the device, a conduction path may be formed resulting in breakage of the device. Alternatively, a concentration of holes near the surface of the semiconductor may be increased due to the diffusion and recombination of the electron-hole pairs, causing an increase in either the potential or the hole current, and thus the device may break or more readily deteriorate. Moreover, a high electric field may be applied between an end portion of the gate electrode, on the drain electrode side, and the AlGaN channel layer, which may also break or deteriorate the device.

To improve high frequency characteristics, an SiN capacitor is connected between a gate electrode and a source electrode. However, because SiN is an insulator, charges generated in the semiconductor resulting from such electron-hole pairs are unable to be removed via the SiN capacitor.

The present invention has been made to solve the problems as described above, and has an object to obtain a compound semiconductor device that is hard to be broken and deteriorated even under a severe environment under which the compound semiconductor device is exposed to high energy particles.

Solution to Problem

A compound semiconductor device according to the present invention includes: a substrate; a semiconductor layer provided on the substrate; a gate electrode, a source electrode and a drain electrode provided on the semiconductor layer; and a strongly correlated electron system material connected between the gate electrode and the source electrode.

Advantageous Effects of Invention

In the present invention, when electron-hole pairs are generated in the device, the strongly correlated electron system material connected to the gate electrode senses potential fluctuation in the device, and conducts phase transition from an insulator to a conductor in a short time. The electron-hole pairs generated in the device pass through the strongly correlated electron system material which has been changed to a conductive material, and flow to the ground, so that the damage to the device can be reduced. Therefore, the compound semiconductor device according to the present invention is hard to be broken and deteriorated even under a severe environment where the compound semiconductor device is exposed to high-energy particles.

DESCRIPTION OF EMBODIMENTS

A compound semiconductor device according to the embodiments of the present invention will be described with reference to the drawings. The same components will be denoted by the same symbols, and the repeated description thereof may be omitted.

First Embodiment

Figure 1:
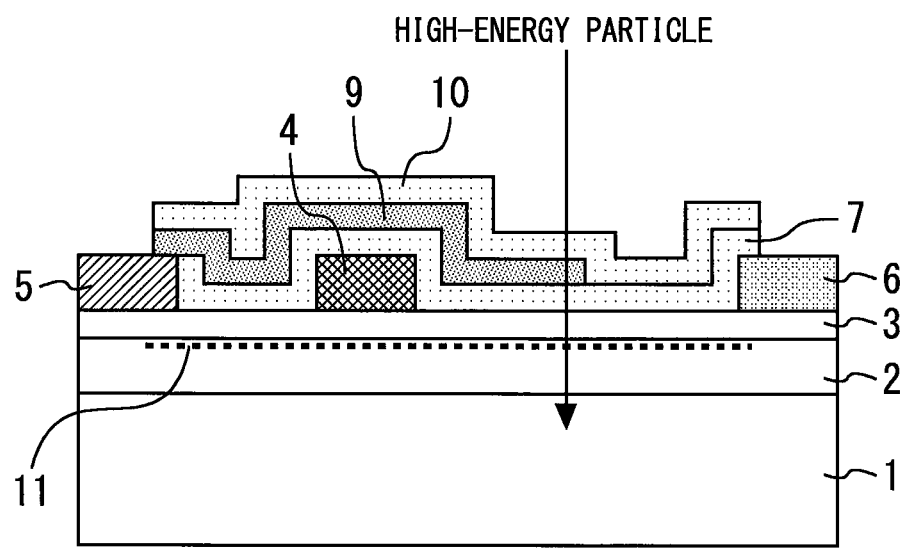
FIG. 1 is a cross-sectional view showing a compound semiconductor device according to a first embodiment of the present invention.

FIG. 1 is a cross-sectional view showing a compound semiconductor device according to a first embodiment of the present invention. A GaN buffer layer 2 is formed on an SiC substrate 1. An AlGaN channel layer 3 is formed on the GaN buffer layer 2. A gate electrode 4, a source electrode 5 and a drain electrode 6 are formed on the AlGaN channel layer 3.

A first passivation film 7 covers the gate electrode 4 and the AlGaN channel layer 3. A source field plate 9 is formed on the first passivation film 7, and extends from the source electrode 5 to a space between the gate electrode 4 and the drain electrode 6. The source field plate 9 relaxes the electric field between the gate electrode 4 and the drain electrode 6, enables a high voltage operation, and further reduces a parasitic capacitance, thereby improving high frequency characteristics. In order to protect the entire device, a second passivation film 10 covers the first passivation film 7 and the source field plate 9.

When a voltage is applied between the source electrode 5 and the drain electrode 6, and a high frequency is input to the gate electrode 4 while a desired bias voltage is applied to the gate electrode 4, electrons in two-dimensional electron gas 11 move at a high speed, whereby the compound semiconductor device operates as an amplifier capable of obtaining an amplified high frequency power from the drain electrode 6.

Figure 2:
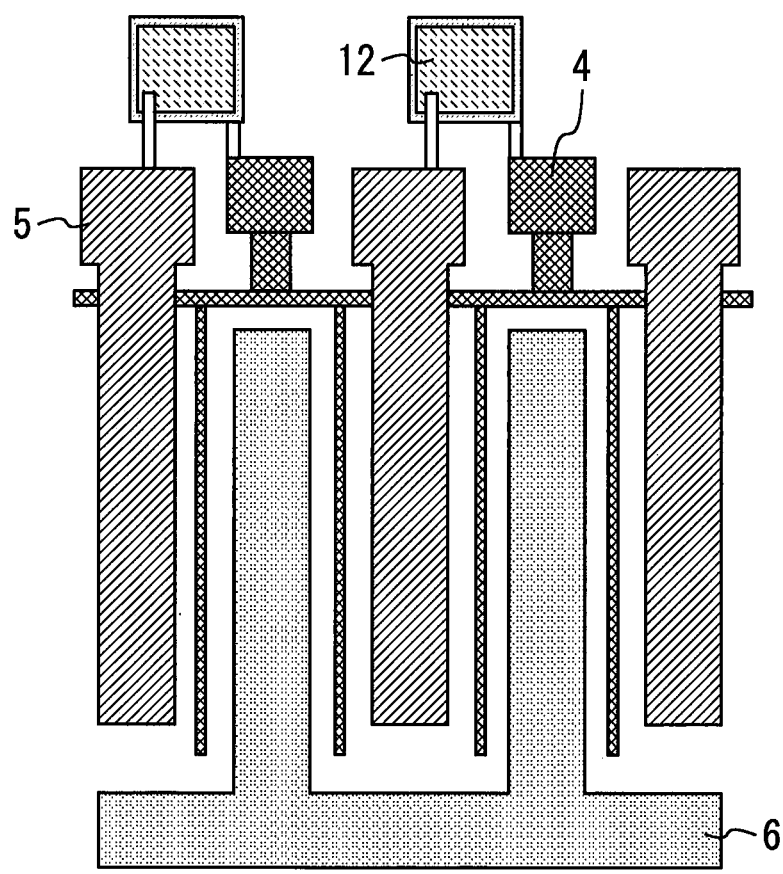
FIG. 2 is a plan view showing the compound semiconductor device according to the first embodiment of the present invention.
Figure 3:
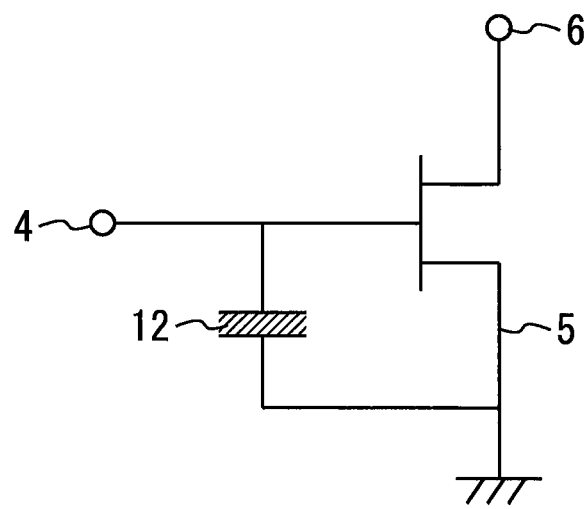
FIG. 3 is a circuit diagram of the compound semiconductor device according to the first embodiment of the present invention.

FIG. 2 is a plan view showing the compound semiconductor device according to the first embodiment of the present invention. FIG. 3 is a circuit diagram of the compound semiconductor device according to the first embodiment of the present invention. A strongly correlated electron system material 12 is connected between the gate electrode 4 and the source electrode 5. The source electrode 5 is connected to the ground.

Representative examples of the strongly correlated electron system material 12 are $VO_2$, $SrTiO_3$, $LaVO_3$, $SrO$, etc., and many materials showing strong correlation such as copper oxide type, Fe type, Mn type, and superconducting type have been reported. The strongly correlated electron system material 12 is an MOTT insulator exhibiting insulation properties although it is filled with electrons because the electrons have excessively strong correlation and thus do not freely move therein. It is known that when the strongly correlated electron system material 12 is stimulated with a voltage, temperature, light or the like, it conducts phase transition to a conductive material. Since the strongly correlated electron system material 12 can be formed and processed by a method which is usually used in a semiconductor process such as a PLD method, it can be easily incorporated into an existing semiconductor manufacturing process.

When high-energy particles are incident to the device, the high energy particles may pass through the second passivation film 10, the source field plate 9, the first passivation film 7, the AlGaN channel layer 3, and the GaN buffer layer 2 and reach the SiC substrate 1. Incoming particles are heavy particles, protons, electrons, neutrons, muons, etc., and have energy of about 1 keV to 100 GeV. A large amount of electron-hole pairs are generated around a trajectory through which high-energy particles have passed. In a conventional structure, the semiconductor is greatly damaged by the generated electron-hole pairs and broken or deteriorated in the process of diffusion, drift, recombination and extinction of the generated electron-hole pairs in the device.

In the present embodiment, when electron-hole pairs are generated in the device, the strongly correlated electron system material 12 connected to the gate electrode 4 senses potential fluctuation in the device, and conducts phase transition from an insulator to a conductor in a short time. The electron-hole pairs generated in the device pass through the strongly correlated electron system material 12 which has been changed to a conductive material, and flow to the ground, so that the damage to the device can be reduced. Therefore, the compound semiconductor device according to the present embodiment is hard to be broken and deteriorated even under a severe environment where the compound semiconductor device is exposed to high-energy particles.

Figure 4:
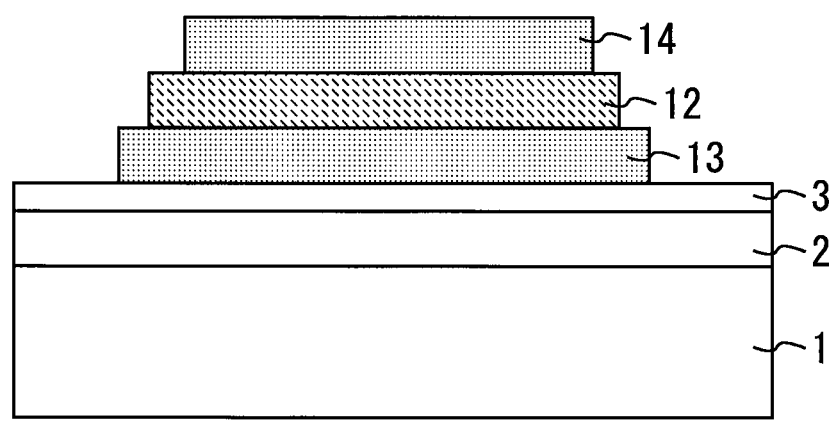
FIG. 4 is a cross-sectional view showing the strongly correlated electron system material according to the first embodiment of the present invention.

FIG. 4 is a cross-sectional view showing the strongly correlated electron system material according to the first embodiment of the present invention. A base electrode 13 is arranged on the SiC substrate 1. The base electrode 13 is connected to the gate electrode 4. A thin film of the strongly correlated electron system material 12 is formed on the base electrode 13. An upper electrode 14 is formed on the strongly correlated electron system material 12. The upper electrode 14 is connected to the source electrode 5. As described above, the strongly correlated electron system material 12 can be connected between the source electrode 5 and the drain electrode 6 with a simple structure similar to that of a capacitor. Furthermore, by arranging the strongly correlated electron system material 12 on the SiC substrate 1, miniaturization of the device can be realized. It is to be noted that the source electrode 5 and the drain electrode 6 may be connected to both ends of the strongly correlated electron system material 12, respectively.

Second Embodiment

Figure 5:
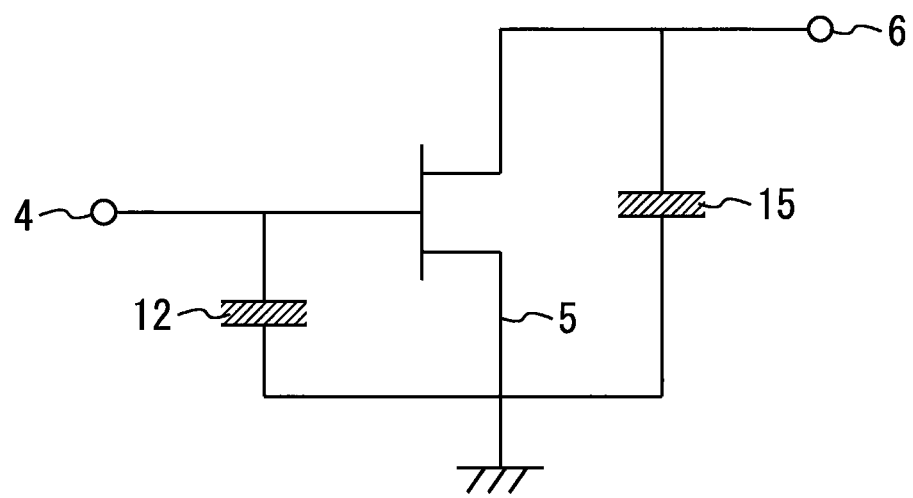
FIG. 5 is a circuit diagram of a compound semiconductor device according to a second embodiment of the present invention.

FIG. 5 is a circuit diagram of a compound semiconductor device according to a second embodiment of the present invention. In the present embodiment, in addition to the configuration of the first embodiment, a strongly correlated electron system material 15 is connected between the source electrode 5 and the drain electrode 6, which enhances the effect because the number of paths through which charges are released increases. It is to be noted that the strongly correlated electron system material 12 on the source side may be omitted while only the strongly correlated electron system material 15 on the drain side is provided, and the same effect as the first embodiment can be obtained.

REFERENCE SIGNS LIST

1 SiC substrate; 2 GaN buffer layer; 3 AlGaN channel layer; 4 gate electrode; 5 source electrode; 6 drain electrode; 12, 15 strongly correlated electron system material; 13 base electrode; 14 upper electrode

The invention claimed is:
1. A compound semiconductor device comprising:
   a substrate;
   a semiconductor layer provided on the substrate;
   a gate electrode, a source electrode and a drain electrode provided on the semiconductor layer; and
   a strongly correlated electron system material connected between the gate electrode and the source electrode and being an MOTT insulator which senses potential fluctuation in the compound semiconductor device and conducts phase transition from an insulator to a conductor when a high-energy particle passes through the compound semiconductor device, thereby generating an electron-hole pair in the compound semiconductor device.

2. The compound semiconductor device according to claim 1, wherein the strongly correlated electron system material is arranged on the substrate.

3. The compound semiconductor device according to claim 2, wherein the strongly correlated electron system material is sandwiched between a base electrode and an upper electrode.

4. The compound semiconductor device according to claim 1, wherein
   the semiconductor layer is a semiconductor channel layer.

5. The compound semiconductor device according to claim 1, wherein
   the strongly correlated electron system material is connected between a base electrode connected to the gate electrode and an upper electrode connected to the source electrode.

6. A compound semiconductor device comprising:
a substrate;
a semiconductor layer provided on the substrate;
a gate electrode, a source electrode and a drain electrode provided on the semiconductor layer; and
a strongly correlated electron system material connected between the source electrode and the drain electrode and being an MOTT insulator which senses potential fluctuation in the compound semiconductor device and conducts phase transition from an insulator to a conductor when a high-energy particle passes through the compound semiconductor device, thereby generating an electron-hole pair in the compound semiconductor device.

7. The compound semiconductor device according to claim 6, wherein the strongly correlated electron system material is arranged on the substrate.

8. The compound semiconductor device according to claim 7, wherein the strongly correlated electron system material is sandwiched between a base electrode and an upper electrode.

9. The compound semiconductor device according to claim 6, wherein
the semiconductor layer is a semiconductor channel layer.

10. The compound semiconductor device according to claim 6, wherein
the strongly correlated electron system material is connected between a base electrode connected to the gate electrode and an upper electrode connected to the source electrode.

* * * * *